United States Patent
Ochi et al.

(10) Patent No.: US 12,284,496 B2
(45) Date of Patent: Apr. 22, 2025

(54) AUDIO PROCESSING DEVICE, AMPLIFIER DEVICE, AND AUDIO PROCESSING METHOD

(71) Applicant: Roland Corporation, Shizuoka (JP)

(72) Inventors: Toshiyuki Ochi, Shizuoka (JP); Yoshinobu Morimoto, Shizuoka (JP)

(73) Assignee: Roland Corporation, Shizuoka (JP)

( * ) Notice: Subject to any disclaimer, the term of this patent is extended or adjusted under 35 U.S.C. 154(b) by 345 days.

(21) Appl. No.: 17/952,323

(22) Filed: Sep. 26, 2022

(65) Prior Publication Data
US 2023/0125554 A1   Apr. 27, 2023

(30) Foreign Application Priority Data
Oct. 26, 2021  (JP) .................. 2021-174834

(51) Int. Cl.
*H04R 3/04*  (2006.01)
*H03F 3/183* (2006.01)

(52) U.S. Cl.
CPC ............... *H04R 3/04* (2013.01); *H03F 3/183* (2013.01); *H03F 2200/03* (2013.01)

(58) Field of Classification Search
CPC ........ H04R 3/04; H03F 3/183; H03F 2200/03
See application file for complete search history.

(56) References Cited

U.S. PATENT DOCUMENTS

| | | | | |
|---|---|---|---|---|
| 3,842,205 A | * | 10/1974 | Okamoto | G10H 1/045 381/62 |
| 6,627,808 B1 | * | 9/2003 | Coats | G10H 3/186 84/723 |
| 7,206,419 B1 | * | 4/2007 | Poletti | H03F 3/183 84/625 |
| 2009/0041265 A1 | * | 2/2009 | Kubo | H04R 3/04 381/98 |
| 2010/0086148 A1 | * | 4/2010 | Hung | H03G 5/165 381/98 |
| 2013/0051581 A1 | * | 2/2013 | Kawano | H04R 3/04 381/98 |
| 2016/0150347 A1 | * | 5/2016 | Fischer | H04R 3/14 381/303 |
| 2018/0326919 A1 | * | 11/2018 | Toda | B60R 11/0217 |
| 2021/0203294 A1 | * | 7/2021 | Ochi | G10H 1/46 |

FOREIGN PATENT DOCUMENTS

| | | | |
|---|---|---|---|
| JP | 2021107906 | 7/2021 | |
| WO | WO-2011003148 A1 * | 1/2011 | G10H 3/185 |

OTHER PUBLICATIONS

Darkglass Electronics(kcmusic.jp), "Microtubes X Ultra," with English translation thereof, 2022, pp. 1-2, Available at: https://kcmusic.jp/darkglass/1664.

* cited by examiner

*Primary Examiner* — Oyesola C Ojo
(74) *Attorney, Agent, or Firm* — JCIPRNET (57) ABSTRACT

An audio processing device includes: a first low-pass filter (LPF) to which an audio signal is input; a circuit to which the audio signal is input, including a first high-pass filter (HPF) and a preamplifier; a second HPF to which the audio signal is input; a second LPF to which an output signal of the circuit is input; an extractor, extracting each of an output signal of the first LPF, an output signal of the second HPF, and an output signal of the second LPF at a predetermined ratio; and a mixer, mixing the output signal of the first LPF, the output signal of the second HPF, and the output signal of the second LPF that are extracted.

16 Claims, 9 Drawing Sheets

AUDIO PROCESSING DEVICE, AMPLIFIER DEVICE, AND AUDIO PROCESSING METHOD

CROSS-REFERENCE TO RELATED APPLICATIONS

This application claims the priority benefit of Japan Application No. 2021-174834, filed on Oct. 26, 2021. The entirety of the above-mentioned patent application is hereby incorporated by reference herein and made a part of this specification.

BACKGROUND

Technical Field

The disclosure relates to an audio processing device, an amplifier device, and an audio processing method.

Related Art

Conventionally, there is an amplifier that is connected to an electric guitar, amplifies a signal from the electric guitar and outputs a loud sound (see, for example, Japanese Patent Laid-Open No. 2021-107906).

SUMMARY

According to one aspect of the disclosure, provided is an audio processing device including: a first low-pass filter to which an audio signal is input; a circuit to which the audio signal is input, including a first high-pass filter and a preamplifier; a second high-pass filter to which the audio signal is input; a second low-pass filter to which an output signal of the circuit is input; an extractor, extracting each of an output signal of the first low-pass filter, an output signal of the second high-pass filter, and an output signal of the second low-pass filter at a predetermined ratio; and a mixer, mixing the output signal of the first low-pass filter, the output signal of the second high-pass filter, and the output signal of the second low-pass filter that are extracted by the extractor.

According to another aspect of the disclosure, provided is an amplifier device including: an audio processing device, processing an audio signal inputted from a musical instrument; and a power amplifier, amplifying a signal outputted from the audio processing device. The audio processing device includes: a first low-pass filter to which an audio signal is input; a circuit to which the audio signal is input, including a first high-pass filter and a preamplifier; a second high-pass filter to which the audio signal is input; a second low-pass filter to which an output signal of the circuit is input; an extractor, extracting each of an output signal of the first low-pass filter, an output signal of the second high-pass filter, and an output signal of the second low-pass filter at a predetermined ratio; and a mixer, mixing the output signal of the first low-pass filter, the output signal of the second high-pass filter, and the output signal of the second low-pass filter that are extracted by the extractor.

According to another aspect of the disclosure, provided is an audio processing method in which the following are performed by an audio processing device. An audio signal is inputted to a first low-pass filter. The audio signal is inputted to a circuit that includes a first high-pass filter and a preamplifier. The audio signal is inputted to a second high-pass filter. An output signal of the circuit is inputted to a second low-pass filter. Each of an output signal of the first low-pass filter, an output signal of the second high-pass filter, and an output signal of the second low-pass filter is extracted at a predetermined ratio. The output signal of the first low-pass filter, the output signal of the second high-pass filter, and the output signal of the second low-pass filter that are extracted are mixed. According to another aspect of the disclosure, a program that causes a computer to operate as an audio processing device or a non-transitory storage medium storing the program may be provided.

DESCRIPTION OF THE EMBODIMENTS

The disclosure provides an audio processing device, an amplifier device, and an audio processing method in which an audio signal having a desired frequency characteristic can be generated by signal mixing.

An amplifier device (for example, a guitar amplifier) is configured to be able to distort an audio signal of a performance sound from a musical instrument such as an electric guitar and output an interesting sound. Hence, the amplifier device includes a blend circuit for mixing the audio signal.

Figure 1A:
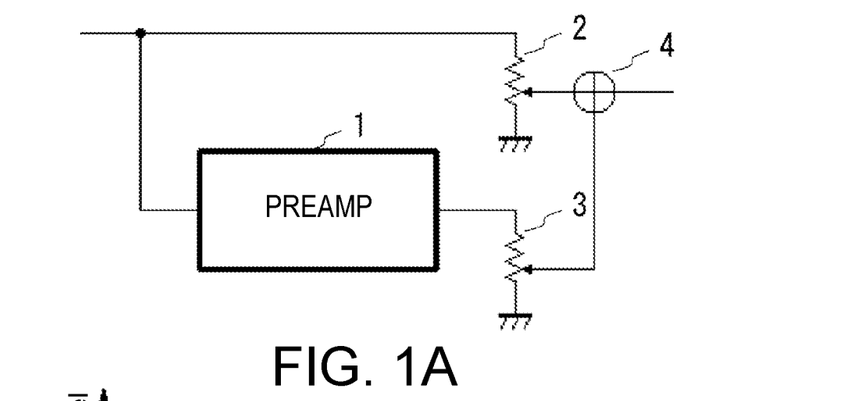
FIG. 1A illustrates a blend circuit of an audio signal according to Reference Example 1.

FIG. 1A illustrates a blend circuit of an audio signal according to Reference Example 1. In the blend circuit shown in FIG. 1A, a path of an original audio signal (input signal) is branched into a first path and a second path, and a preamplifier (PREAMP) 1 is provided in the first path. The preamplifier 1 is an amplifier circuit that distorts an audio signal by amplifying an input signal. The second path is configured to allow the original audio signal to flow therethrough. The original audio signal and an output signal from the preamplifier 1 are extracted at a desired ratio using each of a variable resistor 2 and a variable resistor 3 that adjust a magnitude of the output signal, and are mixed by a mixer 4. Accordingly, an audio signal in which the original audio signal and the output signal from the preamplifier 1 are mixed at a predetermined ratio is outputted from the blend circuit.

Figure 1B:
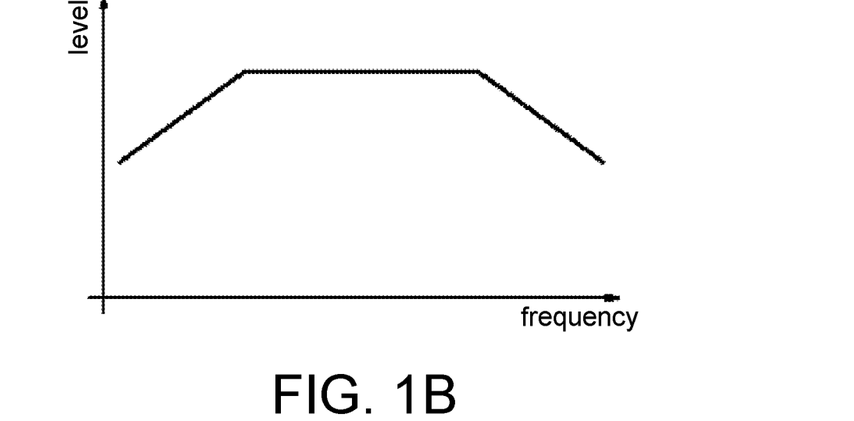
FIG. 1B is a graph illustrating a frequency characteristic of a preamplifier 1.

FIG. 1B is a graph illustrating a frequency characteristic of the preamplifier 1. The preamplifier 1 includes a filter that moderately cuts low and high frequencies in order to obtain a suitable distorted sound, and has a frequency characteristic as shown in FIG. 1B.

Figure 1C:
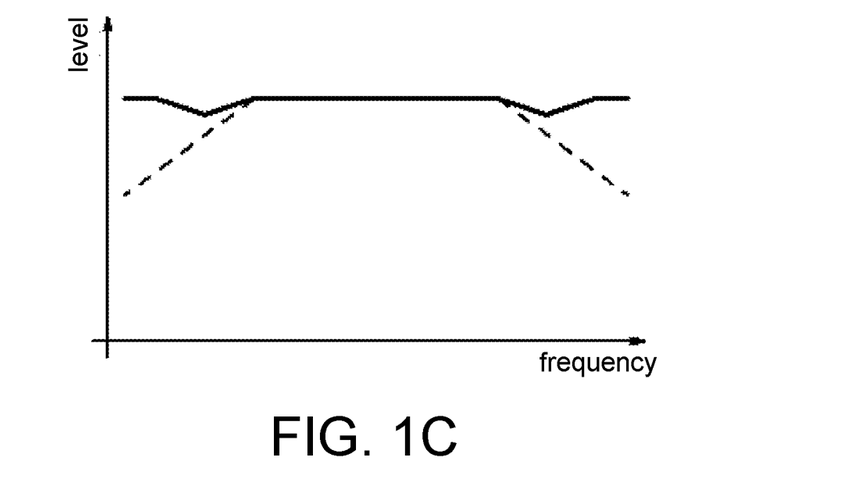
FIG. 1C is a graph illustrating a frequency characteristic of an output signal of the blend circuit of Reference Example 1.

FIG. 1C illustrates a frequency characteristic of an output signal from the blend circuit of Reference Example 1. As shown in FIG. 1C, in the case where the original audio signal and the audio signal from the preamplifier are blended, a flat characteristic cannot be achieved due to phase interference. Hence, there is a possibility that a listener may hear an unpleasant sound or be unable to hear a low frequency sound that they expect to hear and may therefore recognize a sound to be of low quality.

Figure 2A:
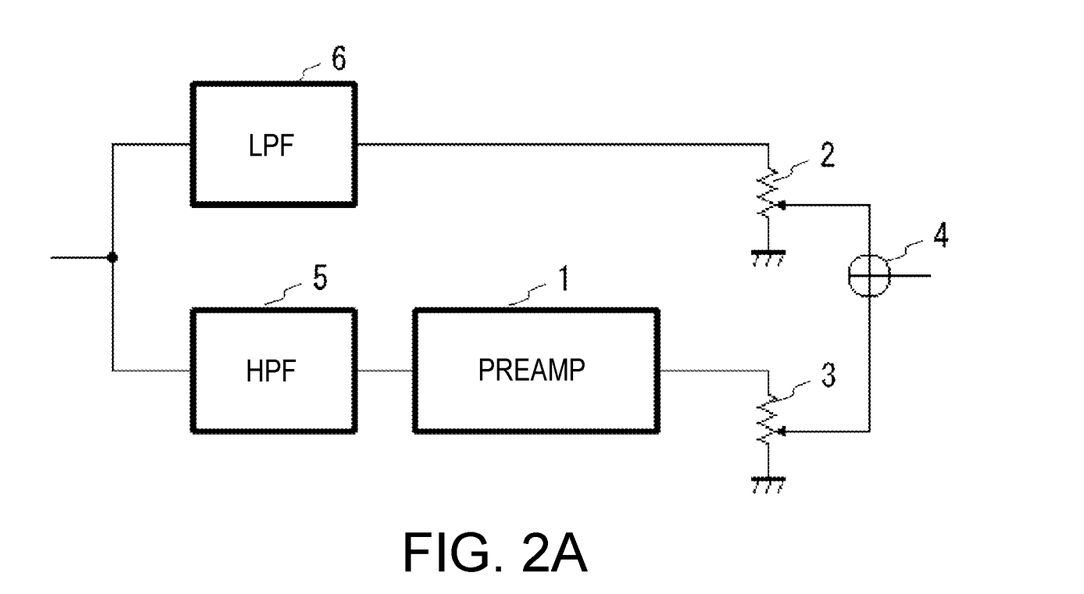
FIG. 2A illustrates a configuration example of a blend circuit according to Reference Example 2.

FIG. 2A illustrates a configuration example of a blend circuit according to Reference Example 2. In Reference Example 2, the configuration of Reference Example 1 is changed as follows. That is, a high-pass filter (HPF) 5 is provided in a stage preceding the preamplifier 1 in the first path of the two branch paths. The HPF 5 extracts a high frequency component from the input audio signal. A low-pass filter (LPF) 6 is provided in the second path. The LPF 6 extracts a low frequency component from the input audio signal. An output signal of the LPF 6 and an output signal of the preamplifier 1 are extracted at a desired ratio by the variable resistors 2 and 3 and are blended by the mixer 4.

In Reference Example 2, by cutting the low frequency component of the audio signal inputted to the preamplifier 1 by the HPF 5, inappropriate amplification (which may cause sound collapse or clipping) with respect to the low frequency component by the preamplifier 1 may be avoided. On the other hand, the low frequency component from the LPF 6 is blended into the output signal of the preamplifier 1 by the mixer 4, so that the low frequency component of the original audio signal is included in the output signal of the blend circuit.

Figure 2B:
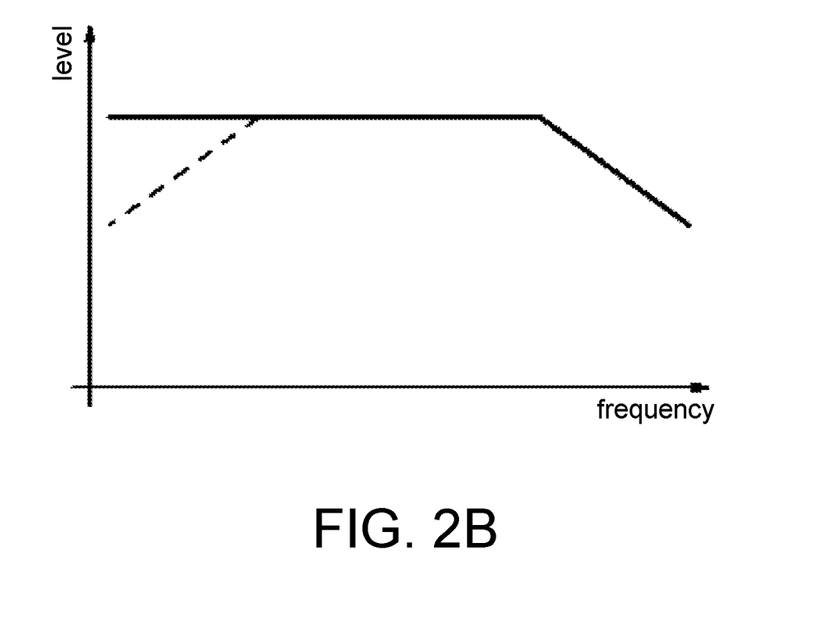
FIG. 2B is a graph illustrating a frequency characteristic of an output signal of the blend circuit of Reference Example 2.

FIG. 2B illustrates a frequency characteristic of the output signal of the blend circuit of Reference Example 2. A signal from which the low frequency component has been cut by the HPF 5 is inputted to the preamplifier 1, and the high frequency component is moderately cut by the preamplifier 1. The low frequency component of the original audio signal is blended into the output signal of the preamplifier 1 like this. Accordingly, in comparison with Reference Example 1 (FIG. 1C), a flat characteristic may be achieved in the low frequency range. By the LPF 6 cutting the high frequency component, distortion due to phase interference in the high frequency range may be suppressed. Accordingly, according to the blend circuit of Reference Example 2, an original low frequency portion and a high frequency overtone component (caused by distortion processing using the preamplifier 1) of the musical instrument can be adjusted, and a thick overdrive sound can be easily achieved.

However, Reference Example 2 has the following problems. That is, in Reference Example 2, the high frequency range of the original audio signal is moderately cut in the preamplifier 1. Hence, as shown in FIG. 2B, there is a problem that the high frequency component included in the original audio signal may be cut from the output signal of the blend circuit of Reference Example 2, and sound quality of high frequency sound may deteriorate from that of the original audio signal. In the following description, a blend circuit (audio processing device) that solves the problem and an amplifier device equipped with the blend circuit will be described.

Figure 3:
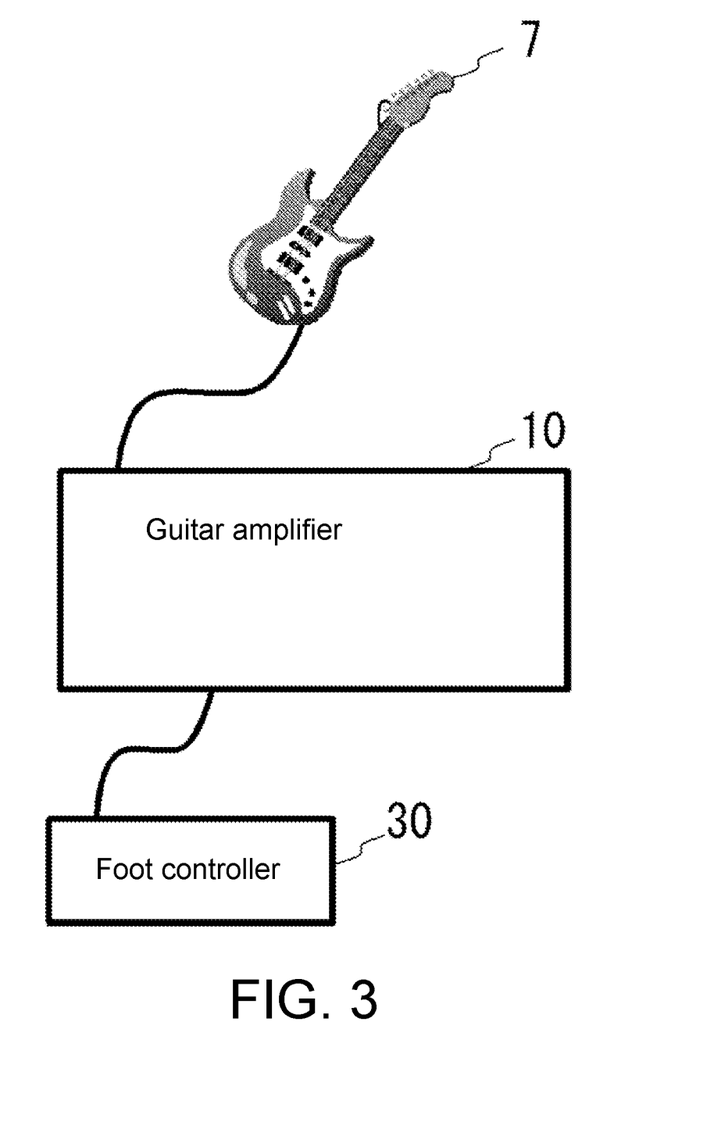
FIG. 3 illustrates a guitar amplifier to which a blend circuit (audio processing device) according to an embodiment is applicable.

FIG. 3 illustrates a guitar amplifier 10 (amplifier device) to which a blend circuit according to an embodiment is applicable. An electric guitar 7 (for example, a bass guitar) is connected to the guitar amplifier 10. The electric guitar 7 is an example of a musical instrument, and the blend circuit according to the embodiment is applicable to a musical instrument other than a guitar.

Figure 4:
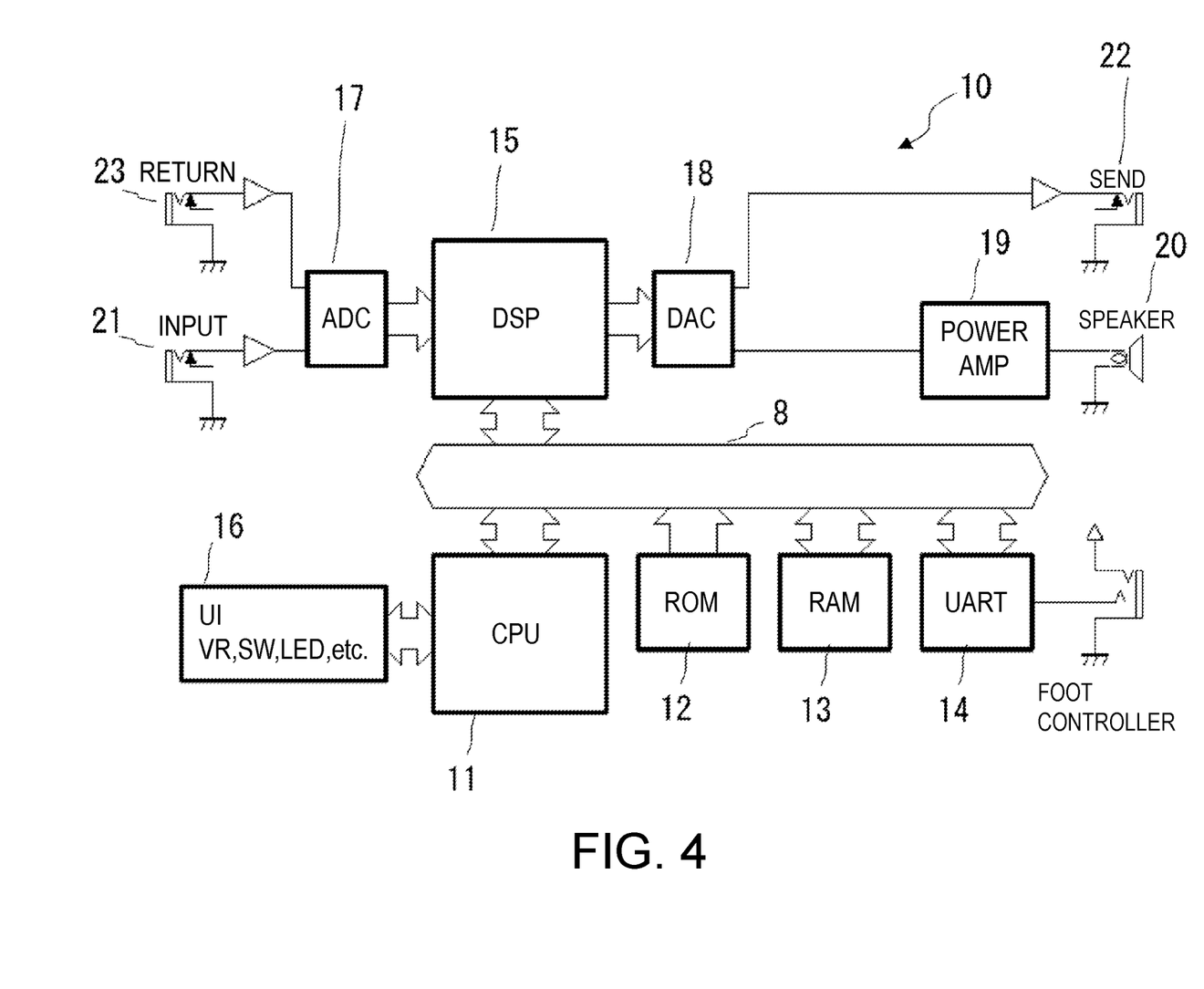
FIG. 4 illustrates a circuit configuration example of a guitar amplifier.

FIG. 4 illustrates a circuit configuration example of the guitar amplifier 10. In FIG. 4, the guitar amplifier 10 has a central processing unit (CPU) 11 that controls overall operation. The CPU 11 is connected to a read only memory (ROM) 12, a random access memory (RAM) 13, a universal asynchronous receiver/transmitter (UART) 14 and a digital signal processor (DSP) 15 via a bus 8. A user interface (UI) 16 is connected to the CPU 11.

The RAM 13 is used as a work area of the CPU 11 and an area storing programs or data. The ROM 12 is used as an area storing programs or data. The RAM 13 and the ROM 12 are examples of a storage device (storage medium). The UART 14 is used for communicating with a foot controller 30.

The guitar amplifier 10 has an INPUT terminal 21, a SEND terminal 22 and a RETURN terminal 23. The INPUT terminal 21 is connected to the electric guitar 7 and receives an electrical signal (audio signal or musical tone signal) generated by playing the electric guitar 7. The SEND terminal 22 is a terminal for transmitting an audio signal to an external device (for example, an external effector). The RETURN terminal 23 is a terminal for inputting an audio signal outputted from the external device.

The audio signals inputted to the INPUT terminal 21 and the RETURN terminal 23 are analog-to-digital converted by an analog-to-digital converter (ADC) 17 and are inputted to the DSP 15. By executing a program, the DSP 15 performs controls such as pitch control, filter control, amplification, or effect impartment on a signal received from the electric guitar 7. The DSP 15 also functions as a blend circuit 40 (described later) by executing a program. An audio signal outputted from the DSP 15 is inputted to a digital-to-analog converter (DAC) 18, converted to an analog signal, and sent to the SEND terminal 22 and a power amplifier 19. The power amplifier 19 amplifies the signal and connects it to a speaker 20, and a sound corresponding to the audio signal is emitted from the speaker 20.

The UI 16 includes an input device, such as a knob, a switch, an indicator (such as a lamp or an LED), a button, or a key, inputting and setting multiple set values (parameters) to the guitar amplifier 10, and a display displaying a state or settings of the guitar amplifier 10.

By executing a program, the CPU 11 performs processing for storing, in the RAM 13, information such as the parameters related to the settings of the guitar amplifier 10 created using the UI 16 and processing for setting the parameters related to the settings to the DSP 15. By executing a program stored in the ROM 12 or the RAM 13, the DSP 15 is able to operate as a blend circuit (audio processing device) under the control of the CPU 11. That is, the DSP 15 corresponds to an audio processing device or a computer.

Figure 5:
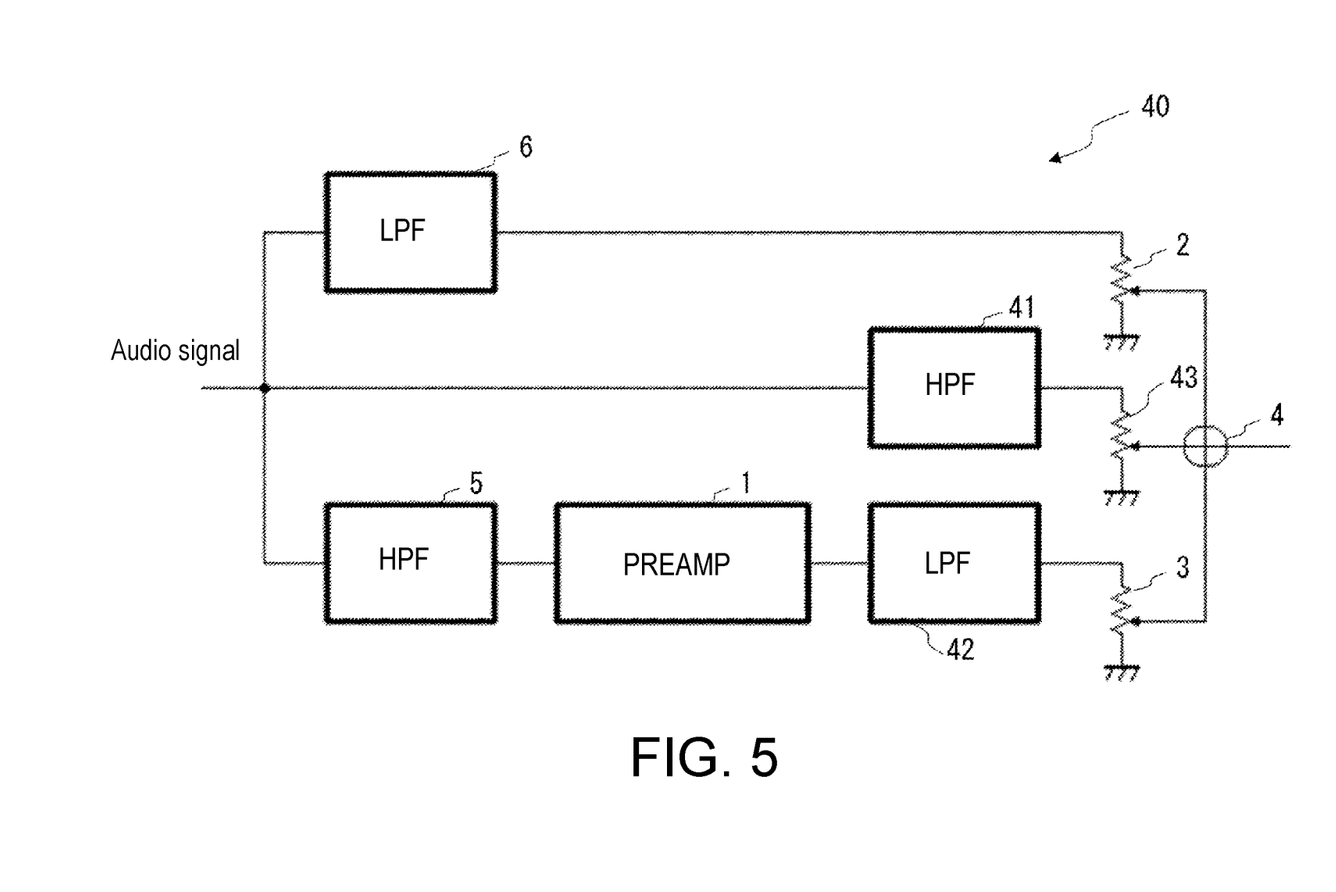
FIG. 5 illustrates a configuration example of a blend circuit according to a first embodiment.

FIG. 5 illustrates a configuration example of the blend circuit 40 according to a first embodiment. The blend circuit 40 is configured by modifying the blend circuit (see FIG. 2A) shown in Reference Example 2 as follows.

That is, in FIG. 5, the preamplifier 1, the variable resistors 2 and 3, the mixer 4, the HPF 5 and the LPF 6 included in the blend circuit 40 may be the same as those of Reference Example 2. Hence, the description thereof is omitted. The variable resistors 2, 43, and 3 are examples of an "extractor". Each of the variable resistors 2, 43, and 3 is used for adjusting the magnitude (current value or voltage value) of an output signal.

In the blend circuit 40, a path of an original audio signal serving as an input signal branches into first to third paths. That is, the path branches into the first path through which the original audio signal is inputted to the HPF 5 (first HPF), the second path through which the original audio signal is inputted to the LPF 6 (first LPF), and the third path through which the original audio signal is inputted to the HPF 41 (second HPF). An output signal of the HPF 41 is connected to the variable resistor 43, and an audio signal extracted by the variable resistor 43 is inputted to the mixer 4.

In the blend circuit 40, an LPF 42 (second LPF) is inserted between the preamplifier 1 and the variable resistor 3. The magnitude of a signal extracted by each of the variable resistors 2, 3, and 43 can be adjusted by a knob or the like included in the UI 16.

Figure 6:
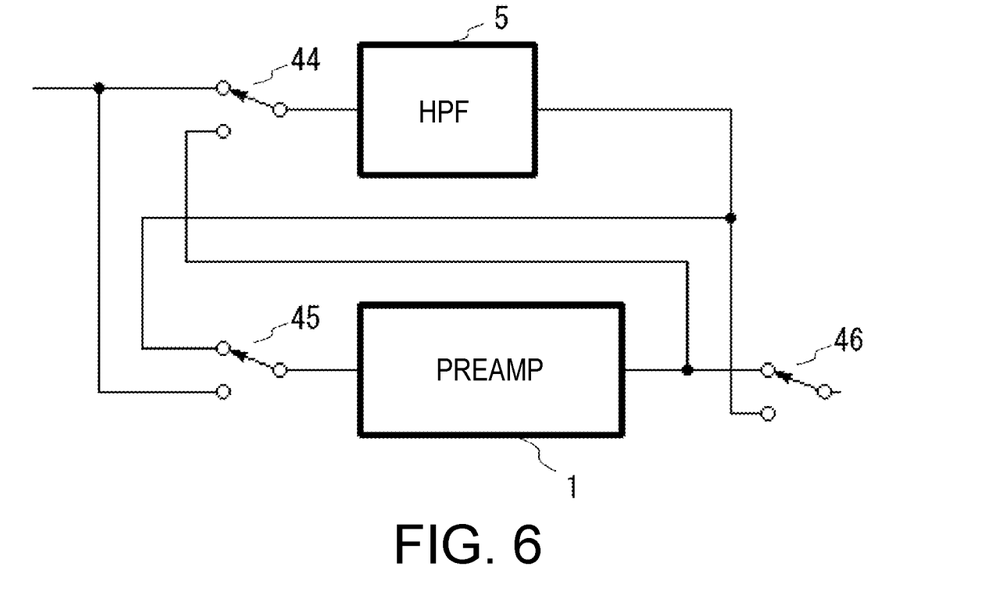
FIG. 6 illustrates a modification of the first embodiment.

The HPF 5 may be arranged in a stage preceding the preamplifier 1 as shown in FIG. 5 or may be arranged in a stage succeeding the preamplifier 1. In other words, the order of the preamplifier 1 and the HPF 5 does not matter. For example, as shown in FIG., a configuration may be adopted in which the HPF 5 and the preamplifier 1 are connected via switches 44, 45 and 46, and the position of the HPF 5 can be changed to either the stage preceding or the stage succeeding the preamplifier 1 by a switching operation of the switches 44, 45 and 46. The switches 44, 45 and 46 are set by, for example, the CPU 11. In the case where the HPF 5 is arranged in the stage preceding the preamplifier 1, a degree of distortion in the low frequency range can be adjusted. In contrast, in the case where the HPF 5 is arranged in the stage succeeding the preamplifier 1, since a low frequency overtone component distorted by the preamplifier 1 can be extracted by the HPF 5, a sense of distortion and sustain can be moderately adjusted. The order and cutoff frequency of each of the LPF 6, the HPF 41, the HPF 5 and the LPF 42 can be appropriately set. The preamplifier 1 and the HPF 5 are examples of a "circuit".

According to the blend circuit 40, an audio signal inputted to an input terminal of the blend circuit 40 branches into the first to third paths and is inputted to the HPF 5, the LPF 6 and the HPF 41. The HPF 5 outputs a signal obtained by cutting the low frequency component of the audio signal. The preamplifier 1 amplifies and distorts the output signal of the HPF 5 and moderately cuts the low and high frequencies. The LPF 42 outputs a signal obtained by cutting the high frequency component of the output signal of the preamplifier 1.

The LPF 6 passes the low frequency component (including a portion cut by the HPF 5) of the original audio signal. The HPF 41 passes the high frequency component (including a portion cut by the LPF 6) of the original audio signal. The output signals from the LPF 6, the HPF 41 and the LPF 42 are extracted at a desired (arbitrary) ratio by adjustment of each of the variable resistors 2, 43 and 3 using the UI 16 and are mixed (blended) by the mixer 4.

Figure 7:
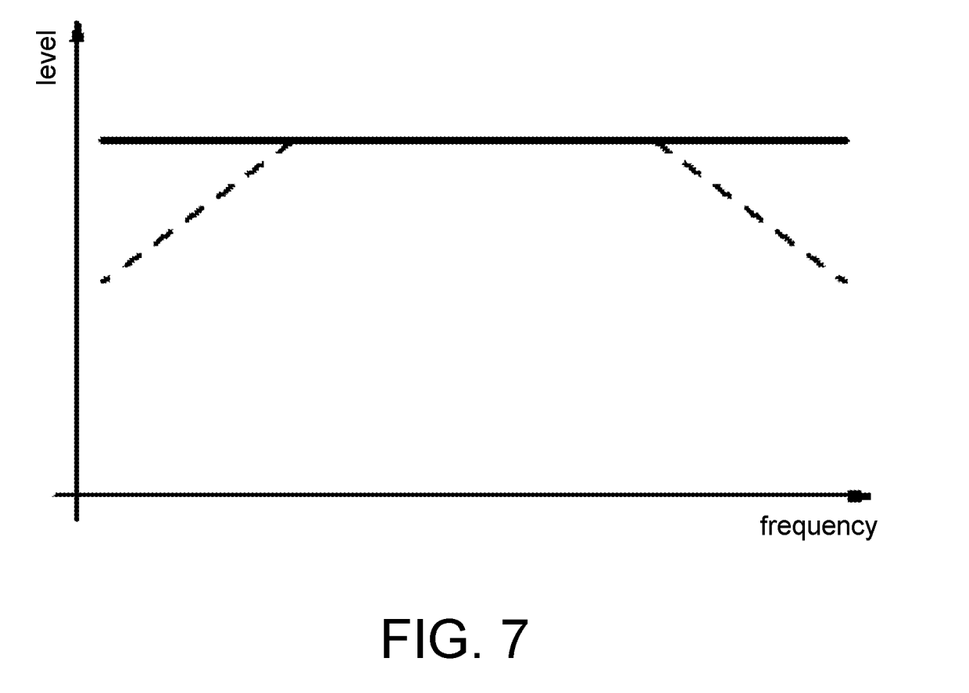
FIG. 7 is a graph illustrating a frequency characteristic of an output signal of the blend circuit according to the first embodiment.

FIG. 7 illustrates a frequency characteristic of an output signal of the blend circuit 40 shown in FIG. 5. As shown in FIG. 7, in the blend circuit 40, the high frequency component of the output signal from the preamplifier 1 is cut by the LPF 42, and the high frequency component of the original audio signal from the HPF 41 is mixed instead. Thus, in an output signal from the mixer 4, an original high frequency component without distortion remains. Thus, since it is possible to blend the high frequency component in which phases are matched, a flat characteristic can be achieved not only for the low frequency component but also for the high frequency component. In other words, a flat characteristic can be achieved for a frequency region cut by the preamplifier 1.

Figure 8:
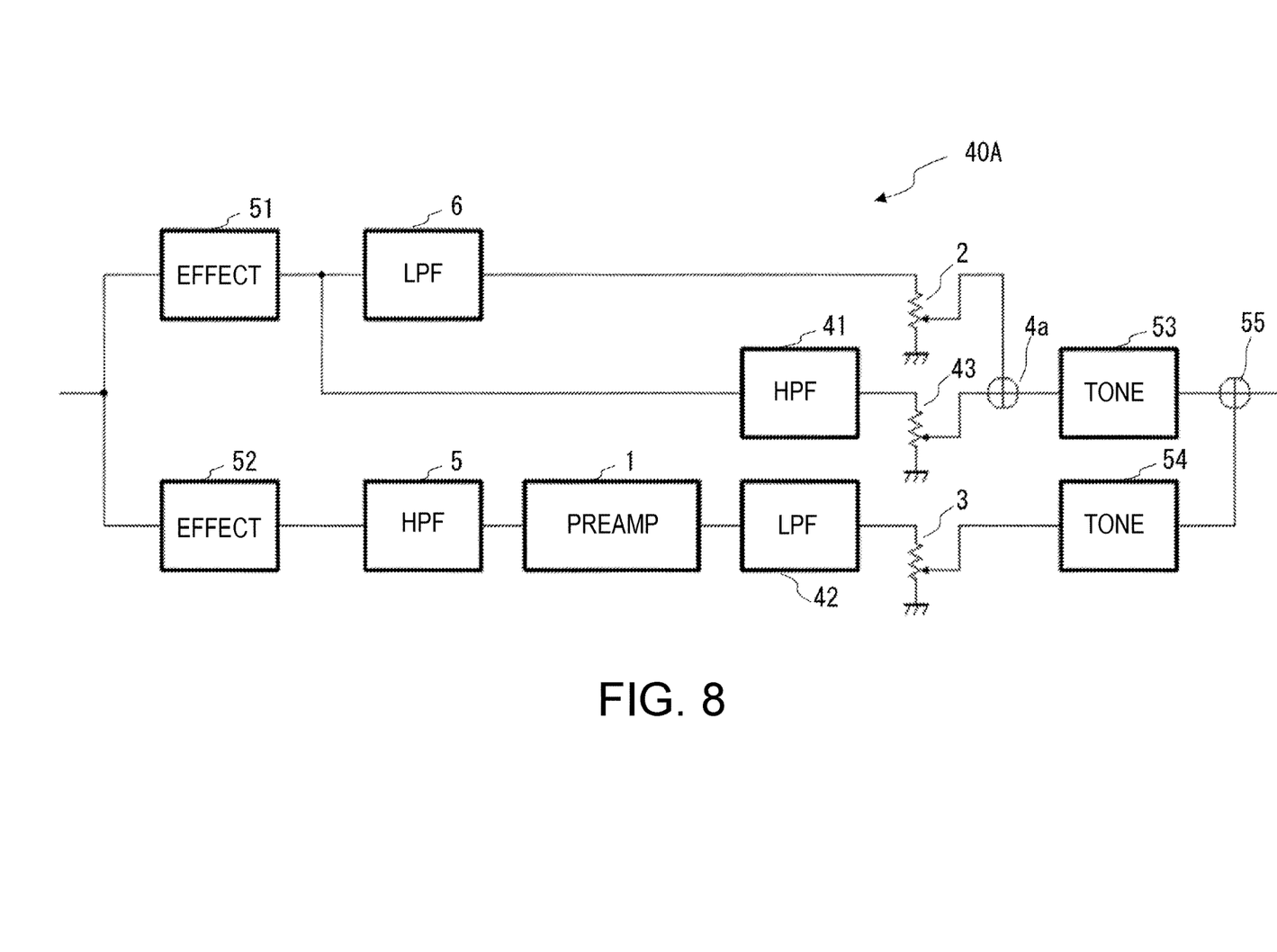
FIG. 8 illustrates a configuration example of a blend circuit according to a second embodiment.

FIG. 8 illustrates a configuration example of a blend circuit 40A according to a second embodiment. In FIG. 8, the blend circuit 40A differs from the blend circuit 40 in the following points. That is, an effect imparter (EFFECT) 51 and an effect imparter 52 to each of which the original audio signal is input are arranged, and an output signal of the effect imparter 51 is inputted to the LPF 6 and the HPF 41. An output signal of the effect imparter 52 is inputted to the HPF 5.

A mixer 4a (second mixer) is provided in place of the mixer 4 (first mixer). The mixer 4a mixes a signal extracted by each of the variable resistor 2 and the variable resistor 43. An output signal of the mixer 4a is connected (inputted) to a TONE circuit (sound quality adjuster) 53. The variable resistor 3 is used for extracting (adjusting the magnitude of) an output signal of the LPF 42. The signal extracted from the variable resistor 3 is connected (inputted) to a TONE circuit (sound quality adjuster) 54. Output signals of the TONE circuits 53 and 54 are mixed by a mixer 55.

Each of the effect imparters 51 and 52 imparts an effect to the audio signal. The effect imparters 51 and 52 may be configured to impart a desired effect within the guitar amplifier 10, or may be configured to output the audio signal to the outside of the guitar amplifier 10 and receive an input of an audio signal to which an effect has been imparted by an external device. Examples of the effect include overdrive, distortion and fuzz in the case of distortion effects (distortion impartment). Examples of the effect include compressors, limiters and equalizers in the case of dynamics effects (adjusting a sense of dynamics). The type of effect is not limited to the above examples. The effects imparted respectively by the effect imparter 51 and the effect imparter 52 may be of the same type or of different types. In the case of imparting different effects, for example, the effect imparter 51 imparts a dynamics effect, and the effect imparter 52 imparts a distortion effect. However, the disclosure is not limited thereto. At least one of the effect imparter 51 and the effect imparter 52 may be set to allow an audio signal to pass through (state in which no effect is imparted: effect impartment is OFF).

By providing the effect imparters 51 and 52 in a stage preceding the LPF 6, the HPF 41 and the HPF 5, an audio signal having suitable sound quality can be obtained compared to the case of imparting an effect to the output signal from the mixer 4a or the signal extracted from the variable resistor 3. Generally, a distortion effect imparter and a dynamics effect imparter are often connected to a stage preceding a preamplifier. By using a distortion effect imparter or an equalizer effect imparter in the stage preceding the preamplifier, the distortion effect imparter or the equalizer effect imparter can be used as a booster that raises a signal level, and a pleasant overdrive sound can be obtained from the output of the preamplifier.

Figure 9:
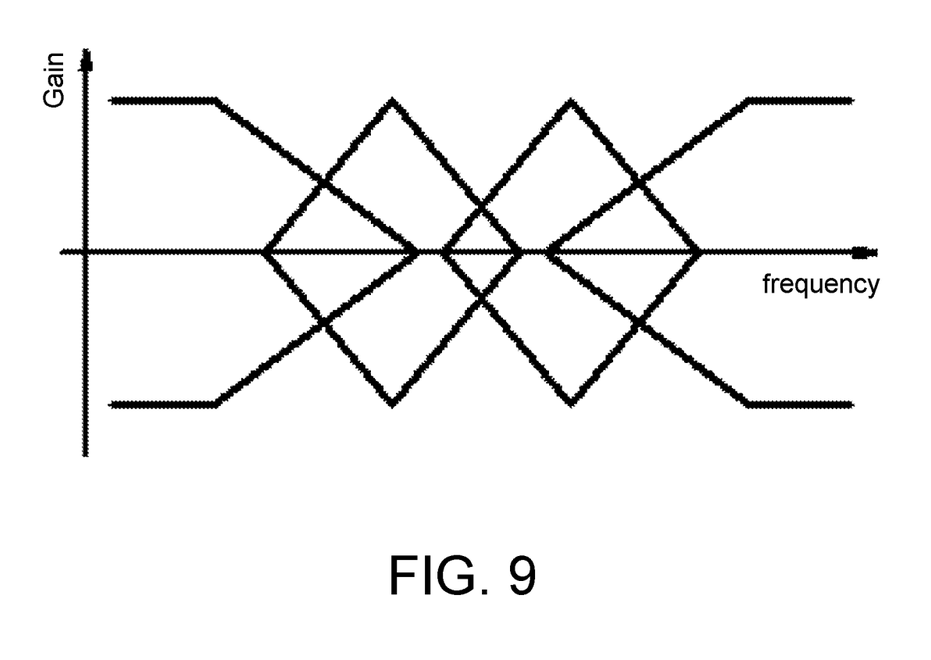
FIG. 9 illustrates a boost/cut frequency characteristic in a TONE circuit.

The TONE circuits 53 and 54 perform sound quality adjustment of low, middle and high frequencies. That is, a user of the guitar amplifier 10 is able to operate the UI 16 and set a parameter (boost/cut frequency characteristic) that specifies the sound quality of each of the low, middle, and high frequencies according to a genre or tempo of a music piece. FIG. 9 illustrates an example of a boost/cut frequency characteristic set in the TONE circuits 53 and 54. The TONE circuits 53 and 54 process (boost or cut each of the low, middle, and high frequencies) an input audio signal according to the parameter and adjust the sound quality.

Figure 10:
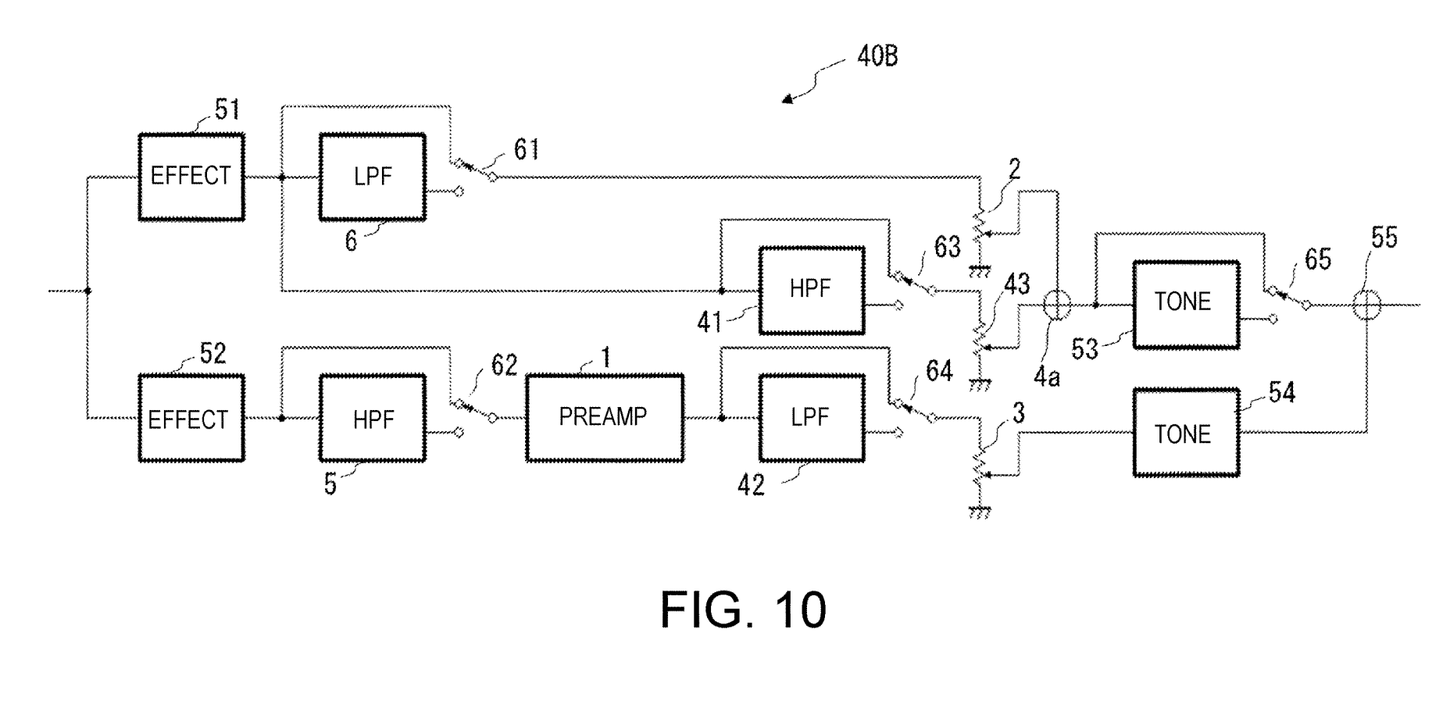
FIG. 10 illustrates a configuration example of a blend circuit according to a third embodiment.

FIG. 10 illustrates a configuration example of a blend circuit 40B according to a third embodiment. The blend circuit 40B differs from the blend circuit 40A in the following points. That is, a switch 61 is provided that selects one of the output signal of the effect imparter 51 and the output signal of the LPF 6. A switch 62 is provided that selects one of the output signal of the effect imparter 52 and the output signal of the HPF 5. A switch 63 is provided that selects one of the output signal of the effect imparter 51 and the output signal of the HPF 41. A switch 64 is provided that selects one of the output signal of the preamplifier 1 and the output signal of the LPF 42. By operation of the switches 61 to 64, the LPF 6, the HPF 5, the HPF 41, the LPF 42, and the TONE circuit 53 can be bypassed. In other words, by operation of the switches 61 to 64, each of the LPF 6, the HPF 41, the HPF 5, and the LPF 42 can be switched on and off.

In the blend circuit 40B, a switch 65 is further provided that selects one of the output signal of the mixer 4a and the output signal of the TONE circuit 53. By operation of the switch 65 in this way, the TONE circuit 53 can be bypassed. That is, it is possible to turn on and off sound quality adjustment (TONE circuit 53) with respect to a mixing signal of the low frequency component and the high frequency component of the original audio signal.

In the embodiments, examples have been described in which the blend circuits 40, 40A and 40B are configured using the DSP 15. However, the blend circuits 40, 40A and 40B may also be composed of analog circuits, or a combination of analog and digital circuits, or digital circuits (for example, field programmable gate arrays (FPGAs) or application specific integrated circuits (ASICs)) other than DSPs.

The audio processing device (blend circuit 40, blend circuit 40A, and blend circuit 40B) according to an embodiment includes: the first LPF (6) to which an audio signal is input; a circuit to which the audio signal is input, including the first HPF (5) and the preamplifier 1; the second HPF (41) to which the audio signal is input; and the second LPF (42) to which an output signal of the circuit is input. The audio processing device also includes: an extractor (variable resistor 2, variable resistor 43, and variable resistor 3), extracting each of an output signal of the first LPF (6), an output signal of the second HPF (41), and an output signal of the second LPF (42) at a predetermined ratio; and the mixer 4, mixing the output signal of the first LPF (6), the output signal of the second HPF (41), and the output signal of the second LPF (42) that are extracted by the extractor.

The preamplifier 1 cuts the low frequency component and the high frequency component of a predetermined frequency from the input audio signal. Each of the HPF 5 and the HPF 41 passes a signal (high frequency component) of a high frequency band that is cut in the preamplifier 1. The LPF 6 passes a signal (low frequency component) of a low frequency band that is cut in at least one of the HPF 5 and the HPF 41. The LPF 42 passes a signal (low frequency component) of a low frequency band that is cut in at least one of the HPF 5 and the HPF 41. For example, each of the LPF 6 and the LPF 42 cuts the high frequency component passed by each of the HPF 5 and the HPF 41.

According to the audio processing device, for example, a signal that has undergone amplification (distortion impartment) with respect to a signal obtained by cutting the low frequency component from the original audio signal by the HPF 5 and cutting (see FIG. 1B) of predetermined high frequency component and low frequency component is outputted from the preamplifier 1. Alternatively, the amplification in which distortion is imparted and the cutting of the high frequency component and low frequency component are performed by the preamplifier 1, and a signal obtained by cutting the low frequency component from the signal obtained by the preamplifier 1 is outputted from the HPF 5. The LPF 42 generates a signal obtained by cutting the high frequency component from the output signal of the preamplifier 1 or the HPF 5.

By the variable resistors 2, 43, and 3 serving as the extractor, a signal (low frequency component, output signal of LPF 6) in the low frequency range of the original audio signal, a signal (high frequency component, output signal of HPF 41) in the high frequency range of the original audio signal, and the output signal of the LPF 42 are extracted at a predetermined ratio and are mixed. Thus, phase matching is performed between the low frequency range and the high frequency range of the signal, and a signal having a flat characteristic can be obtained. That is, according to the audio processing device, a signal having a relatively suitable frequency characteristic than that of Reference Examples 1 and 2 can be obtained.

As shown in the blend circuit 40A, the signal inputted to the LPF 6 and the HPF 41 may be a signal to which an effect has been imparted by a first effect imparter (effect imparter 51). The audio signal inputted to the circuit (HPF 5 or preamplifier 1) may be a signal to which an effect has been imparted by a second effect imparter (effect imparter 52). The effect imparter 52 may not be provided in the blend circuit 40A. The effect imparter 52 may impart the same effect as that imparted by the effect imparter 51, or may impart a different effect.

As shown in the blend circuit 40B, the mixer 4a (second mixer) may be provided in place of the mixer 4, mixing the output signal of the LPF 6 that is extracted by the variable resistor 2 and the output signal of the HPF 41 that is extracted by the variable resistor 43. In this case, there may be provided: the TONE circuit 53 (first sound quality adjuster) performing sound quality adjustment on the output signal of the mixer 4a; the TONE circuit 54 (second sound quality adjuster) performing sound quality adjustment on the output signal of the LPF 42 that is extracted by the variable resistor 3; and the mixer 55 (third mixer) mixing the output signal of each of the TONE circuit 53 and the TONE circuit 54. The configurations shown in the embodiments can be combined as appropriate without departing from the scope of the disclosure.

What is claimed is:

1. An audio processing device, comprising:
a first low-pass filter to which an audio signal is input;
a circuit to which the audio signal is input, comprising a first high-pass filter and a preamplifier;
a second high-pass filter to which the audio signal is input;
a second low-pass filter to which an output signal of the circuit is input;
an extractor, extracting each of an output signal of the first low-pass filter, an output signal of the second high-pass filter, and an output signal of the second low-pass filter at a predetermined ratio;
a mixer, mixing the output signal of the first low-pass filter, the output signal of the second high-pass filter, and the output signal of the second low-pass filter that are extracted by the extractor; and a first effect imparter, inputting the audio signal obtained by imparting an effect to an input audio signal to each of the first low-pass filter and the second high-pass filter.

2. The audio processing device according to claim 1, wherein
the audio signal is inputted to the first high-pass filter, an output signal of the first high-pass filter is inputted to the preamplifier, and an output signal of the preamplifier is inputted to the second low-pass filter.

3. The audio processing device according to claim 1, wherein
the audio signal is inputted to the preamplifier, an output signal of the preamplifier is inputted to the first high-pass filter, and an output signal of the first high-pass filter is inputted to the second low-pass filter.

4. The audio processing device according to claim 1, wherein
at least one of the first high-pass filter, the second high-pass filter, the first low-pass filter and the second low-pass filter is able to be turned on and off.

5. The audio processing device according to claim 1, further comprising:
a second effect imparter, inputting the audio signal obtained by imparting an effect to an input audio signal to the circuit.

6. The audio processing device according to claim 5, wherein
the second effect imparter imparts an effect different from that imparted by the first effect imparter.

7. The audio processing device according to claim 1, comprising:
in place of the mixer, a second mixer mixing the output signal of the first low-pass filter and the output signal of the second high-pass filter that are extracted by the extractor,
and further comprising:
a first sound quality adjuster, performing sound quality adjustment on an output signal of the second mixer;
a second sound quality adjuster, performing sound quality adjustment on the output signal of the second low-pass filter that is extracted by the extractor; and
a third mixer, mixing an output signal of the first sound quality adjuster and an output signal of the second sound quality adjuster.

8. The audio processing device according to claim 2, comprising:
in place of the mixer, a second mixer mixing the output signal of the first low-pass filter and the output signal of the second high-pass filter that are extracted by the extractor,
and further comprising:
a first sound quality adjuster, performing sound quality adjustment on an output signal of the second mixer;
a second sound quality adjuster, performing sound quality adjustment on the output signal of the second low-pass filter that is extracted by the extractor; and
a third mixer, mixing an output signal of the first sound quality adjuster and an output signal of the second sound quality adjuster.

9. The audio processing device according to claim 2, wherein
at least one of the first high-pass filter, the second high-pass filter, the first low-pass filter and the second low-pass filter is able to be turned on and off.

10. The audio processing device according to claim 3, wherein
at least one of the first high-pass filter, the second high-pass filter, the first low-pass filter and the second low-pass filter is able to be turned on and off.

11. The audio processing device according to claim 2, further comprising:
a second effect imparter, inputting the audio signal obtained by imparting an effect to an input audio signal to the circuit, and
the second effect imparter imparts an effect different from that imparted by the first effect imparter.

12. The audio processing device according to claim 3, further comprising:
a second effect imparter, inputting the audio signal obtained by imparting an effect to an input audio signal to the circuit, and
the second effect imparter imparts an effect different from that imparted by the first effect imparter.

13. The audio processing device according to claim 4, further comprising:
a second effect imparter, inputting the audio signal obtained by imparting an effect to an input audio signal to the circuit, and
the second effect imparter imparts an effect different from that imparted by the first effect imparter.

14. An amplifier device, comprising:
an audio processing device, processing an audio signal inputted from a musical instrument; and
a power amplifier, amplifying a signal outputted from the audio processing device,
wherein the audio processing device comprises:
a first low-pass filter to which an audio signal is input;
a circuit to which the audio signal is input, comprising a first high-pass filter and a preamplifier;
a second high-pass filter to which the audio signal is input;
a second low-pass filter to which an output signal of the circuit is input;
an extractor, extracting each of an output signal of the first low-pass filter, an output signal of the second high-pass filter, and an output signal of the second low-pass filter at a predetermined ratio;
a mixer, mixing the output signal of the first low-pass filter, the output signal of the second high-pass filter, and the output signal of the second low-pass filter that are extracted by the extractor; and
a first effect imparter, inputting the audio signal obtained by imparting an effect to an input audio signal to each of the first low-pass filter and the second high-pass filter.

15. The amplifier device according to claim 14, wherein
the audio processing device comprises, in place of the mixer, a second mixer mixing the output signal of the first low-pass filter and the output signal of the second high-pass filter that are extracted by the extractor, and
the audio processing device further comprises:
a first sound quality adjuster, performing sound quality adjustment on an output signal of the second mixer;
a second sound quality adjuster, performing sound quality adjustment on the output signal of the second low-pass filter that is extracted by the extractor; and
a third mixer, mixing an output signal of the first sound quality adjuster and an output signal of the second sound quality adjuster.

16. An audio processing method comprising, by an audio processing device:
inputting an audio signal to a first low-pass filter;

inputting the audio signal to a circuit that comprises a first high-pass filter and a preamplifier;

inputting the audio signal to a second high-pass filter;

inputting an output signal of the circuit to a second low-pass filter;

extracting each of an output signal of the first low-pass filter, an output signal of the second high-pass filter, and an output signal of the second low-pass filter at a predetermined ratio; and mixing the output signal of the first low-pass filter, the output signal of the second high-pass filter, and the output signal of the second low-pass filter that are extracted, inputting the audio signal obtained by imparting an effect to an input audio signal to each of the first low-pass filter and the second high-pass filter.

* * * * *